United States Patent
Barnhill

(10) Patent No.: US 11,770,651 B2
(45) Date of Patent: Sep. 26, 2023

(54) GENETIC-ALGORITHM-BASED EQUALIZATION USING IIR FILTERS

(71) Applicant: THAT Corporation, Milford, MA (US)

(72) Inventor: Matthew S. Barnhill, Berkeley Lake, GA (US)

(73) Assignee: THAT Corporation, Milford, MA (US)

(*) Notice: Subject to any disclaimer, the term of this patent is extended or adjusted under 35 U.S.C. 154(b) by 44 days.

(21) Appl. No.: 17/499,215

(22) Filed: Oct. 12, 2021

(65) Prior Publication Data

US 2022/0116704 A1   Apr. 14, 2022

Related U.S. Application Data

(60) Provisional application No. 63/089,929, filed on Oct. 9, 2020.

(51) Int. Cl.
| | |
|---|---|
| *H04R 3/04* | (2006.01) |
| *H03H 17/04* | (2006.01) |
| *H04R 29/00* | (2006.01) |
| *H03H 17/00* | (2006.01) |
| *H03G 5/02* | (2006.01) |

(52) U.S. Cl.
CPC ............ *H04R 3/04* (2013.01); *H03H 17/04* (2013.01); *H04R 29/001* (2013.01); *H03G 5/025* (2013.01); *H03H 2017/009* (2013.01)

(58) Field of Classification Search
CPC .... H04R 3/04; H04R 29/001; H04R 2430/03; H04R 2499/15; H03H 17/04; H03H 2017/009; H04S 2420/07; H04S 7/301; H03G 5/025

USPC ........... 381/103, 98; 708/322, 323; 333/28 R
See application file for complete search history.

(56) References Cited

U.S. PATENT DOCUMENTS

| | | | |
|---|---|---|---|
| 4,888,809 A | 12/1989 | Knibbeler | |
| 6,195,438 B1 | 2/2001 | Yumoto et al. | |
| 8,121,312 B2* | 2/2012 | Horbach | H04S 7/301 |
| | | | 381/103 |
| 2002/0196951 A1* | 12/2002 | Tsai | H04R 3/04 |
| | | | 381/59 |
| 2005/0008071 A1 | 1/2005 | Bose et al. | |

(Continued)

OTHER PUBLICATIONS

Taiwan Office Action dated Apr. 29, 2022 with English translation of Search Report for Taiwan application No. 110137839; 6 pages.

(Continued)

*Primary Examiner* — Xu Mei
(74) *Attorney, Agent, or Firm* — DALY, CROWLEY, MOFFORD & DURKEE, LLP

(57) ABSTRACT

Systems and methods utilize a modified genetic algorithm for adapting an off-the-shelf audio system, such as in a high-end television, to a given, particular room or other physical location presenting a specific or unique auditory environment with a set of acoustic properties. An audio system is adapted to a given room by determining an IIR based EQ solution via iterative techniques, including an iterative technique based upon a genetic algorithm adapted for an audio frequency response equalization application. In a variant, an audio system is adapted to a particular room, adjust the EQ across a microphone's bandwidth while preserving the factory-calibrated EQ response across the remaining bandwidth.

8 Claims, 8 Drawing Sheets

(56) References Cited

U.S. PATENT DOCUMENTS

| | | |
|---|---|---|
| 2005/0207585 A1 | 9/2005 | Christoph |
| 2007/0174376 A1 | 7/2007 | George |
| 2008/0205667 A1 | 8/2008 | Bharitkar et al. |
| 2013/0114830 A1 | 5/2013 | Eastty |
| 2013/0243221 A1* | 9/2013 | Hsieh .................. H04R 29/004 381/103 |
| 2014/0161280 A1* | 6/2014 | Nackvi .................. H04S 7/305 381/98 |
| 2016/0149550 A1* | 5/2016 | Zhu ........................ H03G 5/165 381/103 |
| 2018/0132049 A1 | 5/2018 | Risberg et al. |
| 2019/0246203 A1 | 8/2019 | Elko et al. |

OTHER PUBLICATIONS

International Search Report and Written Opinion dated May 11, 2022 for PCT Application No. PCT/US2021/054467; 11 pages.

* cited by examiner

GENETIC-ALGORITHM-BASED EQUALIZATION USING IIR FILTERS

CROSS REFERENCE TO RELATED APPLICATIONS

This application claims priority to and benefit of U.S. Provisional Application No. 63/089,929 entitled "Genetic-based Algorithm for Automatic Equalization" (filed Oct. 9, 2020), which is incorporated herein by reference in its entirety.

BACKGROUND

Augmenting the factory tuning of a television (TV) to account for auditory effects and conditions of any particular room presents several challenges to the designer. The processing bandwidth of the TV's system on a chip (SoC) must be considered. Factory based tuning often utilizes high speed laptop computers while in-home tuning is often limited by the available bandwidth of the TV's SoC. Additionally, factory tuning is typically based upon recordings made in the audio near-field in a controlled environment. These recordings are used to compensate for speaker frequency response limitations. In-home tuning, however, typically involves recordings made either at the listener position, or by microphones mounted in the television, in rooms with furniture and doorways, non-uniform surfaces and often windows, i.e., a relatively "hostile" audio environment. These recordings can be used to compensate for both speaker limitations and room effects at the recording position. Recording-device sample rates, for in-home tuning, typically vary from 8 kHz to 48 kHz. And, the recording bandwidth, for example in TV a remote control, is often limited to the voice band (300 to 3 kHz).

Finite Impulse Response (FIR) filters are typically used in audio frequency response equalization (EQ) filter applications. Once the impulse response is known, the FIR solution to compensate for the frequency response of a random listener position in a room is mathematically well defined. The resulting FIR filter is typically of high order and requires significant processor bandwidth to implement. Infinite Impulse Response (IIR) filters with equivalent (to FIR filter) performance have a much lower order and thus require less bandwidth to implement. Once the IIR filter coefficients (EQ solution) are available, they provide a much more efficient method to compensate for a non-ideal room response. IIR filters are recursive and have both zeros and poles making them prone to stability issues. Deriving an IIR based solution for a random room response is a complex mathematical process requiring careful manipulation of the filter zeroes and poles.

SUMMARY

Embodiments of the present disclosure provide the ability to efficiently adapt a factory "off the shelf" audio system to any given room.

One aspect of the present disclosure is directed to adapting an audio system to a given room by determining an IIR based EQ solution via iterative techniques, including an iterative technique based upon a genetic algorithm adapted for an audio frequency response equalization application.

A further aspect of the present disclosure is directed to a system, method, and algorithm that, in tuning an audio system to a particular room, adjusts the EQ across a microphone's bandwidth while preserving the factory-calibrated EQ response across the remaining bandwidth.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

In order to equalize the audio response of a TV audio system, a parametric equalizer (EQ) can be used. Each band of a parametric equalizer has an adjustment for gain, center frequency and quality, Q (an adjustment for bandwidth). When multiple bands are used, the parametric EQ (PEQ) has many degrees of adjustment. Finding the EQ settings that give the desired overall system response for a given room can be a challenging problem. The present disclosure provides novel systems, methods, and genetic-based algorithms (including variants), as described in further detail below, which have been shown to be effective and efficient for finding an optimal solution for equalization for a given room or other enclosed physical space, utilizing IIR PEQ filters (e.g., second order, in exemplary embodiments). Use e of genetic-type algorithms described herein provide increased effectiveness and efficiency for tuning or adapting an audio system to a particular auditory environment.

One aspect the present disclosure is directed to a method/algorithm for adapting IIR filters of a given audio system utilizing a genetic-algorithm approach to implement an ideal EQ response of the audio system, over the entire range (or "full band") of the system's output, for a given room or other auditory environment in which the system is used. For such an approach, details of individual steps are described below with respect to FIGS. 1-6 and details of a corresponding higher-level algorithm are described below with respect to FIG. 7.

Figure 1:
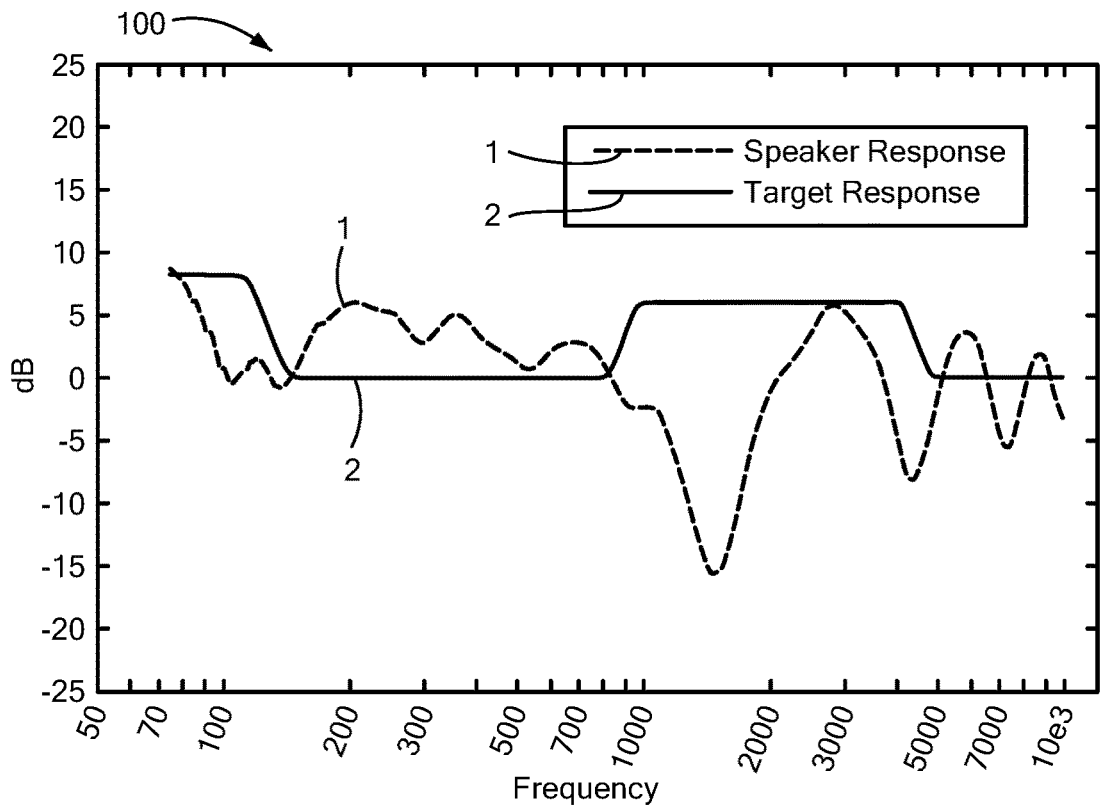
FIG. 1 is a plot showing actual vs. target speaker/room response for a given auditory environment.

As an initial step, the impulse response of the system speaker(s) in the particular room is obtained, e.g., measured or recorded, using a stimulus such as maximum length sequence (MLS). Other stimuli, such as a logarithmic sine sweep, variable speed chirp, etc., can additionally or alternatively be used. The impulse response is then converted to a frequency response with an FFT, and can (optionally) then be smoothed and resampled with logarithmic frequency domain spacing. The system's frequency response is then compared to a desired or target frequency response to derive an ideal EQ response. FIG. 1 is a plot 100 showing actual response vs. target speaker-to-room ("speaker/room") response for a given auditory environment.

Figure 2:
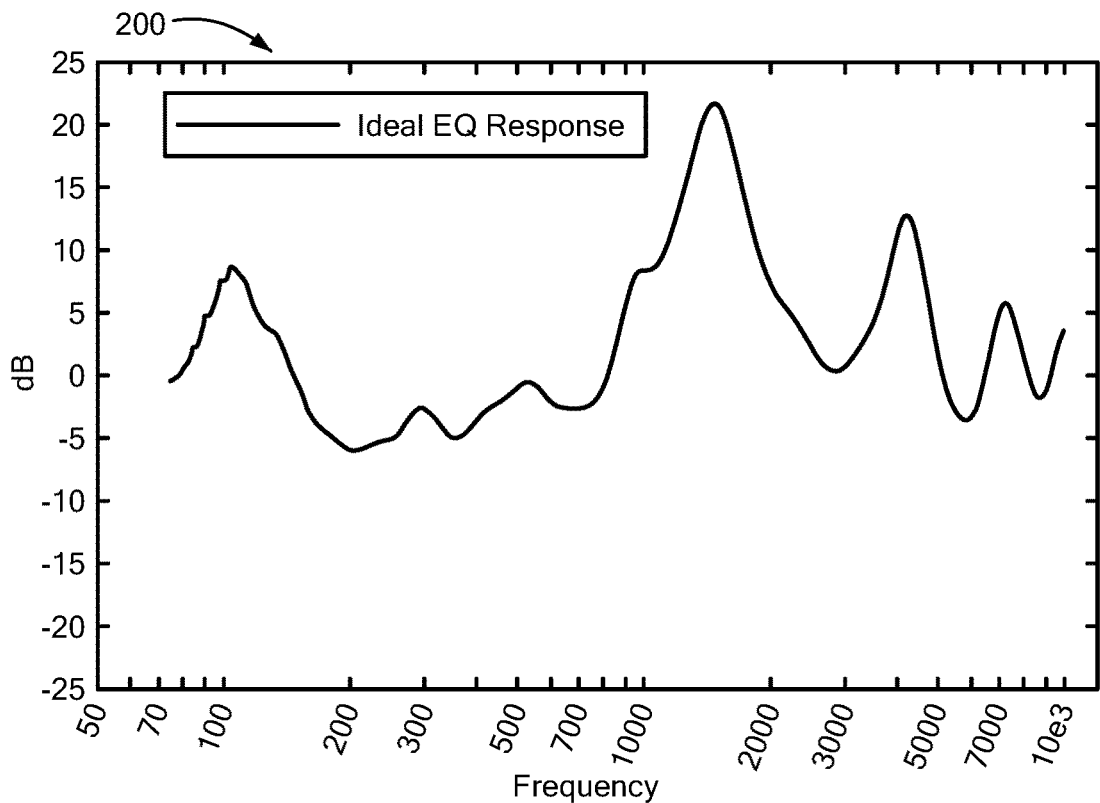
FIG. 2 is a graph showing the difference between the target response and the actual response for the speaker/room of FIG. 1.

The difference between the target response and the speaker response gives the ideal EQ response, as shown by plot 200 in FIG. 2. This ideal EQ response can be derived or calculated by subtracting the systems' actual frequency response from the ideal or target frequency response. The ideal EQ response, when applied to the particular system, would convert the system's actual frequency response to the desired frequency response, thereby adapting the audio system to the particular room or location. Embodiments of the present disclosure operate to quickly and efficiently find the PEQ parameters that make the EQ response most closely match the ideal EQ response.

To find the PEQ parameters that make the EQ response most closely match the target EQ response, exemplary algorithms of the present disclosure utilize a novel type of genetic algorithm (or algorithms), which works by creating a population of chromosomes, where each chromosome is a binary number that represents an encoded set of PEQ parameters, where the set of PEQ parameters span the entire range of the system's output. Each chromosome represents a possible EQ solution. For example, in preferred embodiments, each chromosome dedicates 10 bits to gain, 8 bits to center frequency and 8 bits to Q for each band. The total number of bits per chromosome and the bit allocation can be different depending upon the desired accuracy and/or efficiency.

Figure 3:
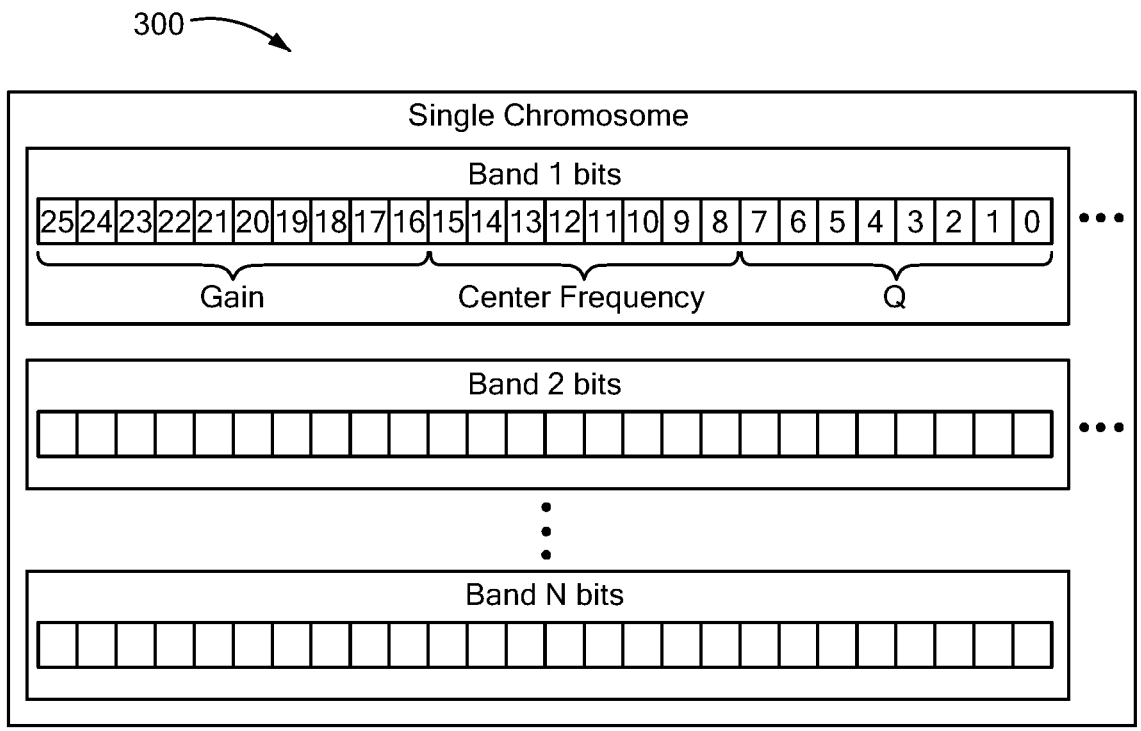
FIG. 3 shows an example of chromosome encoding used for exemplary embodiments of the present disclosure.

FIG. 3 shows an example 300 of chromosome encoding used for exemplary embodiments of the present disclosure. This example shows a chromosome that contains N bands with each band represented by a PEQ filter. It should be understood that, for example, if frequency and bandwidth are fixed (as in a graphic EQ approach), the chromosome could in that situation just contain gain information.

The initial population (first generation) may be created by choosing random values for each chromosome bit. The size of the population can be adjusted. A larger population will tend to have greater diversity and may lead to finding better solutions. A smaller population will require less computation and may be more efficient. The next generation can be created in the following manner. Each chromosome's "fitness" is calculated by computing the mean-square error (MSE) of its frequency response relative to the ideal EQ response. Other fitness metrics, such as mean absolute error or max error can be used in addition to or substitution for MSE. The number of bands in a chromosome can be adjusted as the genetic algorithm progresses. For an example with a seven-band EQ, one could begin the process with only two bands and add additional bands (up to a total of seven) incrementally in future generations.

When MSE is used as a fitness metric, a chromosome with a lower MSE is considered a better solution. In audio applications, some bands are more critical than others. So, when computing the fitness of a chromosome, critical frequency bands are preferably weighted more heavily. The genetic algorithm will naturally drive the EQ error to a lower level in these bands and not dedicate unneeded iterations, filters, or chromosomes to optimize frequency bands that are less important from a listener perception perspective.

Figure 4:
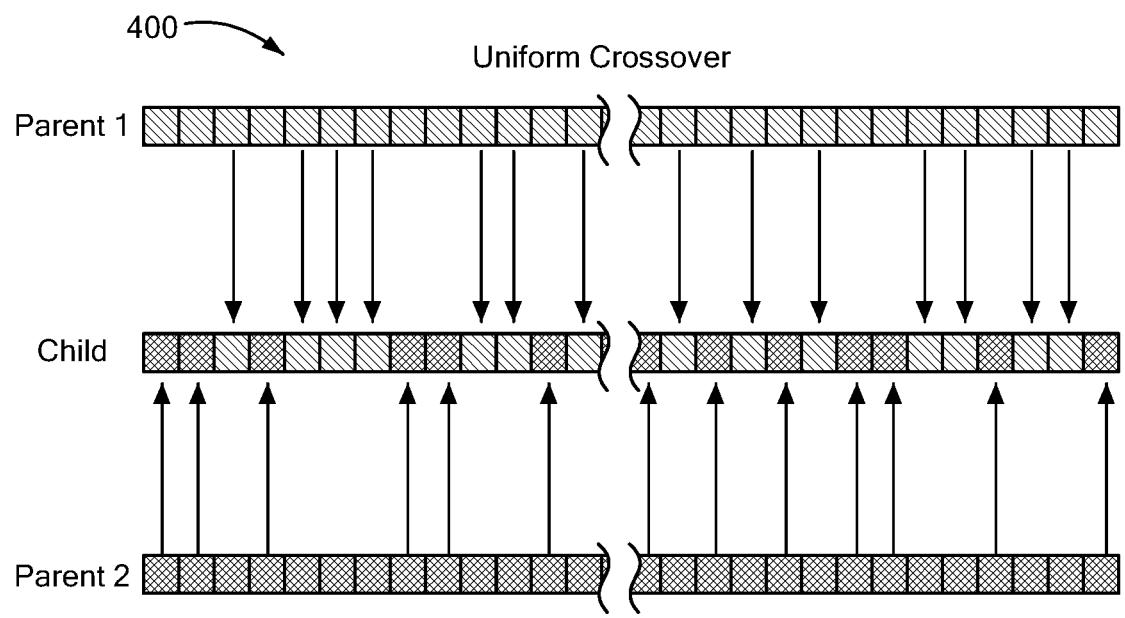
FIG. 4 shows an example of a crossover technique used for exemplary embodiments of the present disclosure.

In preferred embodiments, the chromosome with the best fitness is carried over unchanged to the next generation so that the solution never regresses. Then each chromosome's fitness score is used to weight how likely it is to become a parent for the next generation. Higher fitness means greater likelihood of selection. In this example, 30% of the population becomes parents for the next generation. (Of course, the percentage of the population that becomes parents for the next generation can be adjusted/selected as desired.) Then, each child is created by selecting two random parents and performing a crossover of their chromosomes. FIG. 4 shows an example 400 of a crossover technique used for exemplary embodiments of the present disclosure. A uniform crossover is performed by randomly selecting each child bit from one of the two parents, as shown in FIG. 4. Other techniques, such as single-point or two-point crossovers are also possible. The single-point crossover can be done by choosing a random index and splicing parent 1's values before the index and parent 2's after the index.

Next, as part of the genetic algorithm, random mutations are applied, e.g., by giving each child chromosome bit a small probability of inverting its value. Each child chromosome then has its fitness measured and the process repeats until terminated.

Figure 5:
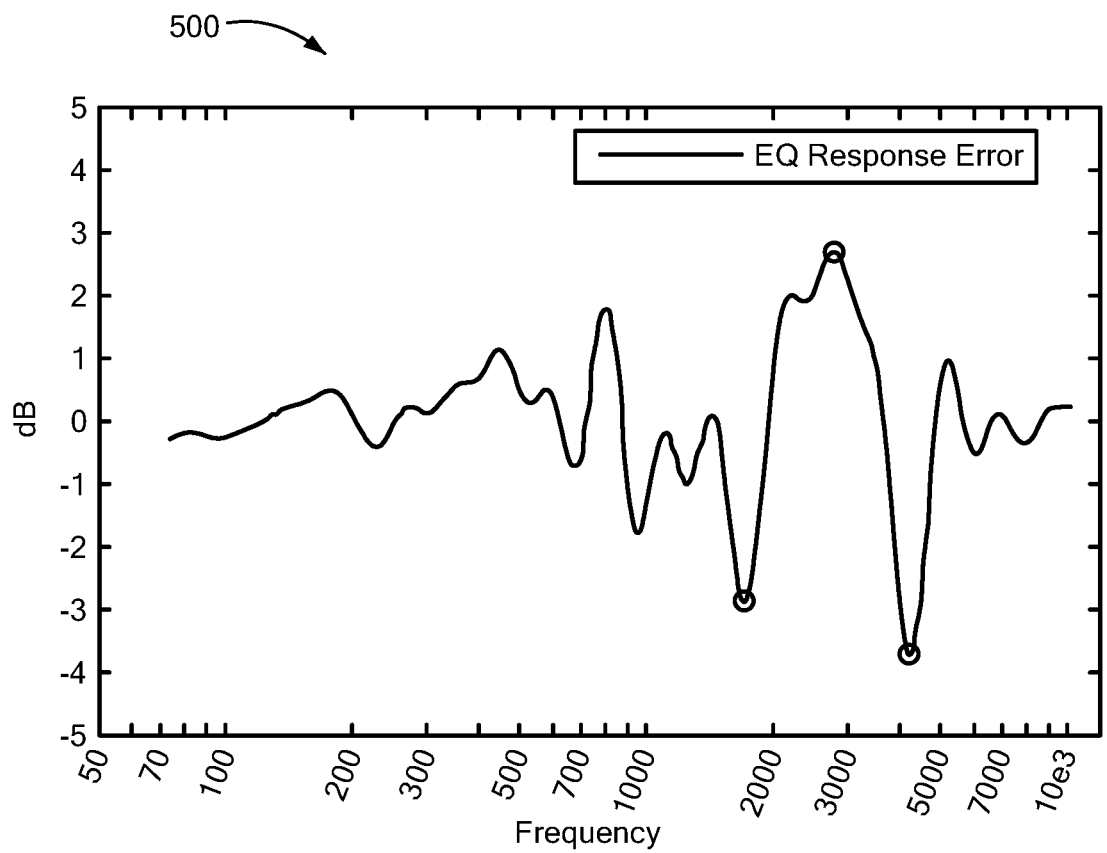
FIG. 5 is a plot showing an example identification of three largest-error peaks from a best current solution, in accordance with an exemplary embodiment of the present disclosure.

In audio applications it is reasonable to tune a total of seven parametric EQ bands, e.g., as used in preferred embodiments of the present disclosure. But, for the beginning of the described process used in exemplary embodiments, only two PEQs bands are initially tuned. This feature of the audio EQ adaptation algorithm exploits the fact that a smaller population will require less computation. Then, after a fixed number of generations, an additional band (or bands) is added until eventually all seven are included. This is done to give more reliable results in fewer total generations. While seven parametric bands are referenced, a different number of such bands can be used in other embodiments or applications. FIG. 5 is a plot 500 showing an example identification of three largest-error peaks from a best current solution, in accordance with an exemplary embodiment of the present disclosure.

When a new PEQ band is added, the new chromosome bits are given initial values that are computed as follows. The three peaks having the largest error (i.e., the largest-error peaks) from the best current solution are identified, as shown in FIG. 5. PEQ parameters are calculated that provide a narrow (high Q) corresponding gain that drives the error to zero at those points. This application-specific modification allows each introduced audio EQ band to lower the chromosome fitness before adaptation even begins. As a result, it enables the adaptation of PEQ parameters—and consequently IIR filters values used for the adaptation of the given particular audio system—to converge to a suitable solution much more quickly when compared to prior art techniques. The combination of adding EQ bands over time coupled with fitness-based initialization of the added bands provides a method to improve the effectiveness and efficiency of the genetic algorithm in an audio EQ application, adapting a given audio system to a given room or location.

One of the three sets of parameters is appended to each child. The new PEQ bands are free to evolve on their own when the algorithm resumes. This approach is used to speed up the evolutionary process instead of waiting for the appropriate values to be found randomly.

Figure 6:
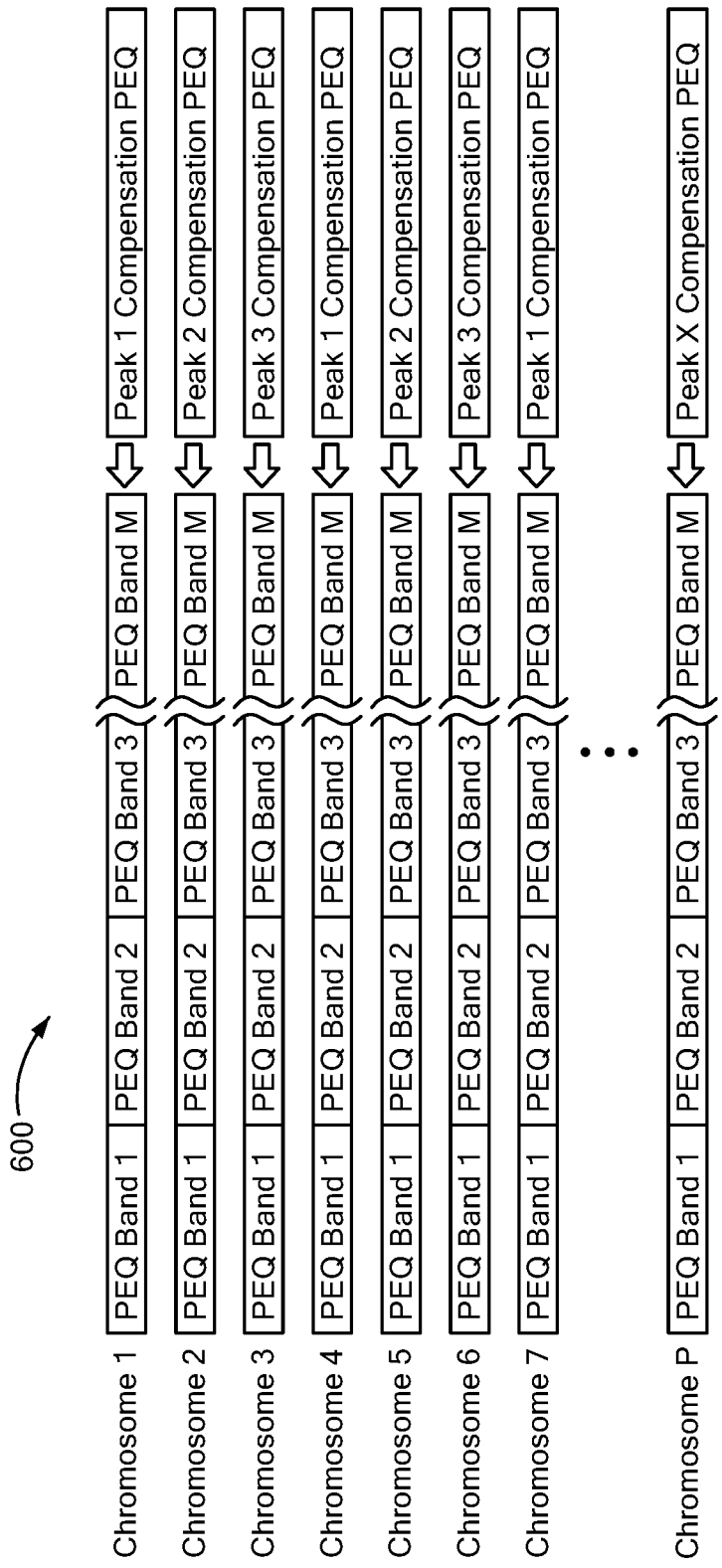
FIG. 6 is a diagram showing the addition of a new PEQ band to each chromosome.

FIG. 6 is a diagram 600 showing the addition of a new PEQ band. FIG. 6 illustrates adding a New PEQ Band, where P is the population size and M is the number of PEQ bands currently being tuned. M is less than the number of bands available in the implemented EQ.

When calculating a chromosome's fitness value, the bits are converted to their frequency, gain, and Q values. When they're converted from their binary values back to their parameter values, they are treated as Gray coded values. Gray code (Gray coding) is preferably used to make the evolution smoother and faster. In a Gray code, the next value in a sequence can always be reached by changing only a single bit (as opposed to binary coding).

TABLE 1

Gray Code vs Binary

| Decimal | Binary | Gray |
|---|---|---|
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |
| 8 | 1000 | 1100 |
| 9 | 1001 | 1101 |
| 10 | 1010 | 1111 |
| 11 | 1011 | 1110 |
| 12 | 1100 | 1010 |
| 13 | 1101 | 1011 |
| 14 | 1110 | 1001 |
| 15 | 1111 | 1000 |

In a 4-bit example, the binary value for 7 is 0111 and is 1000 for 8. With Gray code, the value for 7 is 0100 and 8 is 1100. If a gain value needed to evolve slightly from 7 to the nearest value of 8, it would need to flip all 4 bits simultaneously in binary but only a single bit in Gray code. With the binary code, the adaptation would tend to get stuck trying to evolve from 7 to 8. With Gray code, nearer values are easier to reach through mutations. Gray coding the PEQ parameters provides a means to reach a satisfactory solution using fewer iterations, and a smaller population size, for a genetic algorithm when applied to audio EQ applications according to the present disclosure.

The algorithm terminates or completes (or can be considered to have terminated or completed) once all required bands have been added and when an algorithm performance metric or termination criterion is reached, e.g., either a fixed number of generations have been processed or when a target MSE is achieved. The resulting PEQ parameters (returned from the algorithm after termination) are accordingly optimized or tailored to the particular room for which the system's impulse response was initially obtained.

Figure 7:
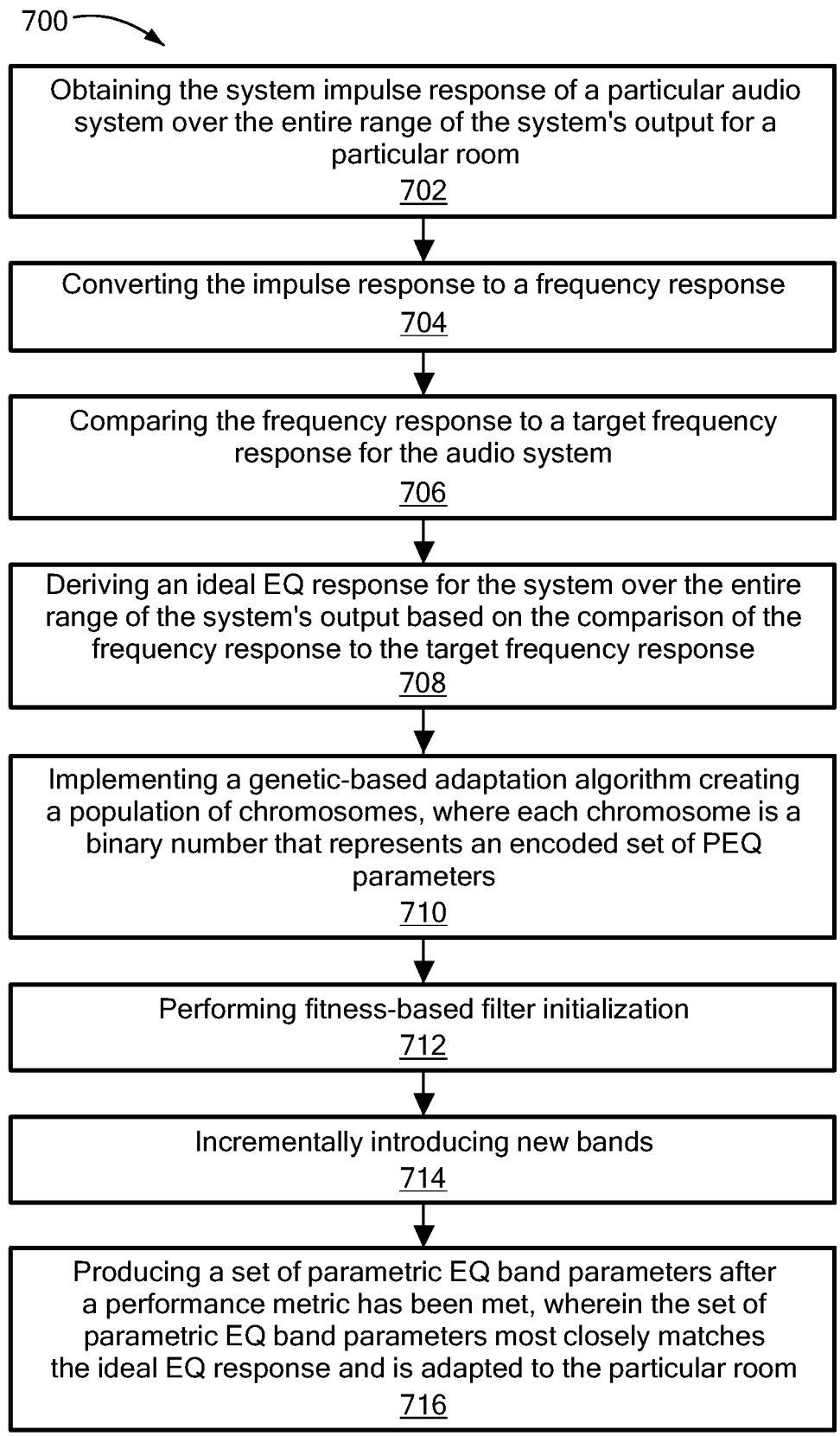
FIG. 7 is a box diagram of an exemplary method of adapting IIR filters to a given room, in accordance with the present disclosure.

FIG. 7 is a box diagram of an exemplary method/algorithm 700 for adapting IIR filters of a given audio system utilizing a genetic-algorithm approach to implement an ideal EQ response of the audio system, over the entire range of the system's output, for a given room or other auditory environment in which the system is used. Method 700, which may also be considered as an algorithm, includes obtaining the system impulse response of a particular audio system over the entire range of the system's output for a particular room, as shown at step 702. The impulse response can be converted to a frequency response, as shown at step 704. The frequency response can be compared to a target frequency response for the audio system, as shown at step 706. An ideal EQ response for the system over the entire range of the system's output can be obtained based on the comparison of the frequency response to the target frequency response, as shown at step 708.

Continuing with the description of method 700, a genetic-based adaption algorithm can be implemented which creates a population of chromosomes, where each chromosome is a binary number that represents an encoded set of PEQ parameters, as shown at step 710. Fitness-based filter initialization can be performed, as shown at step 712. New bands can be added incrementally, as shown at step 714. After a performance metric or termination criterion has been met, a set of parametric EQ band parameters can be returned or obtained from the algorithm, wherein the set of parametric EQ band parameters closely or most closely matches the ideal EQ response and is adapted to the particular room, as shown at step 716.

Sub-Band Approach: A further aspect the present disclosure is directed to method/algorithm for adjusting the EQ response of an audio system across a system microphone's bandwidth while preserving the factory-calibrated EQ response across the remaining bandwidth of the system. For such an approach, details of individual steps are described and shown below with respect to FIGS. 8-10 and details of a corresponding higher-level algorithm are provided below with respect to FIG. 11.

As noted previously, a television's audio characteristics can be factory tuned to give optimal performance for a nominal standardized room, but when placed in a home or other building, the acoustic environment of any given real world r room where the television is used can change the television's spectral characteristics and vocal clarity. Tuning the television to the particular room can greatly improve its performance.

When a user (e.g., "consumer" or "buyer") performs in-home tuning of a TV, the microphone available in the remote control or in the TV typically has a narrower bandwidth than the TV's speakers. As a result, the full bandwidth of the speaker(s) cannot be measured by the microphone. In this case, it is desirable or advantageous to tune only the bandwidth of the EQ that can be recorded by the microphone. Embodiments of the present disclosure operate according to an algorithm (including variants), as described below, that adjusts the EQ of the audio systems across the (its) microphone's bandwidth while preserving the factory-calibrated EQ response across the remaining bandwidth. As a result, the same equalizer, which is initially tuned at the factory, can be shared for optimized speaker-to-room (speaker/room) response EQ in the home without having to dedicate extra filters for in-home adjustments.

Accordingly, for exemplary embodiments, room-specific tuning of an audio system, e.g., of a television, can be accomplished by following a guided procedure. Such a procedure can use a microphone built into the television, remote control, or smartphone to record a stimulus signal played through the television's speakers. For a remote control or smartphone, the consumer will preferably place the remote in one or more listener locations to perform the recording(s). Once the speakers' frequency response is obtained this way, that response can be used to derive an ideal EQ response that equalizes the overall response of the audio system (e.g., television) to match a target response. As only the portion of the measured frequency response that lies within the microphone's bandwidth is available (in this situation), the ideal EQ response derived from such a measurement is, therefore, spliced with the television's factory EQ response to create the full idealized EQ response for the system, which is tailored or adapted to the particular room.

An initial step before splicing is to match the levels of the two responses. The absolute level of the measured response will vary significantly depending on the microphone location and variations in microphone sensitivity and speaker volume. To compensate, the average level of the ideal EQ response over the microphone's bandwidth is shifted to match the average level of the factory EQ response over the same bandwidth.

Figure 8:
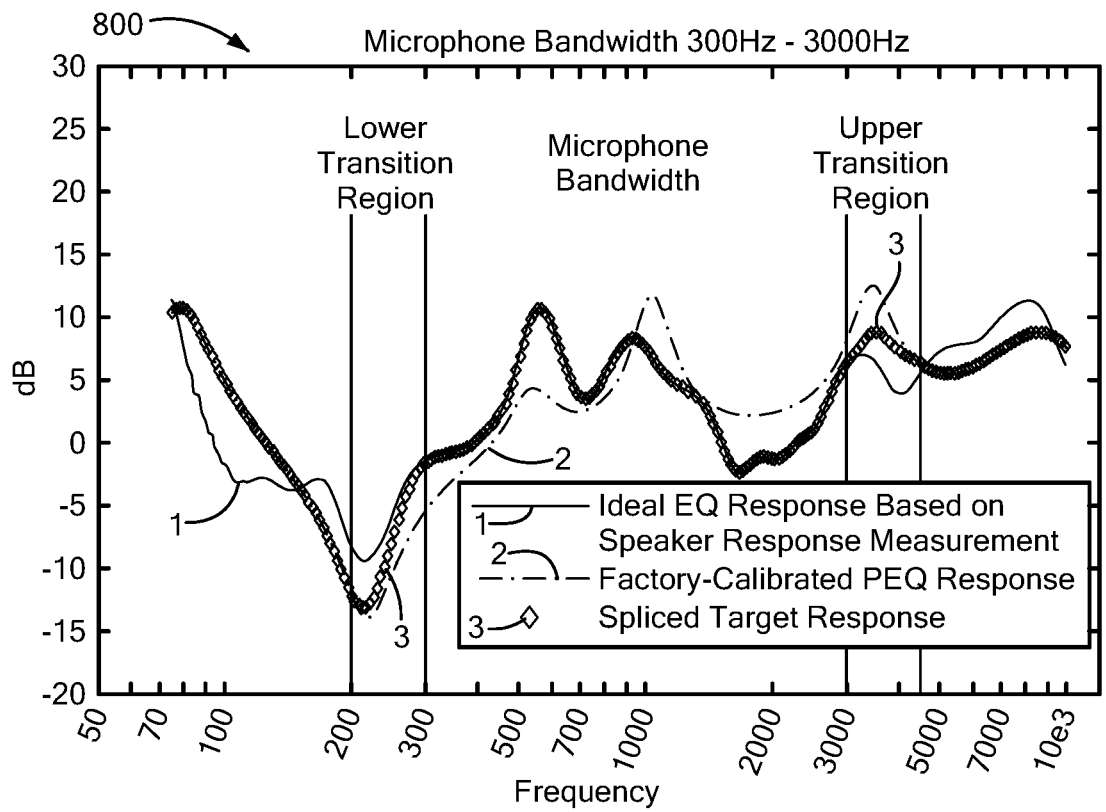
FIG. 8 is a plot showing the initial factory calibrated EQ response, the ideal recording derived response, and the resulting spliced target response, in accordance with an exemplary embodiment of the present disclosure.

Over the microphone's bandwidth, the spliced response is equivalent to the ideal EQ response (or essentially so) that is derived from the in-home (in-room) measurement. Just outside of the microphone's bandwidth are two transition regions that are a half-octave wide or approximately so. In the calculation of the ideal equalizer response in those regions, the spliced response transitions (e.g., linearly transitions) from the measured response to the factory EQ response. FIG. 8 is a plot 800 showing an example of a spliced target response, in accordance with an exemplary embodiment of the present disclosure.

$$H_1(f) = \frac{\left(f - \frac{f_1}{\sqrt{2}}\right)*H_{meas}(f) + (f_1 - f)H_{fac}(f)}{f_1 - \frac{f_1}{\sqrt{2}}} \quad \text{EQ. 1}$$

Equation 1: A half-octave solution where H1 is the spliced response in the lower transition region, $f_1$ is the lower end of the mic bandwidth, $H_{meas}$ is the ideal EQ response based on the measurement and $H_{fac}$ is the factory-calibrated EQ response.

$$H_2(f) = \frac{(f - f_2)*H_{fac}(f) + (\sqrt{2} f_2 - f)H_{meas}(f)}{\sqrt{2} f_2 - f_2} \quad \text{EQ. 2}$$

Equation 2: A half-octave solution where $H_2$ is the spliced response in the upper transition region, $f_2$ is the upper end of the mic bandwidth, $H_{meas}$ is the ideal EQ response based on the measurement and $H_{fac}$ is the factory-calibrated EQ response.

Figure 9:
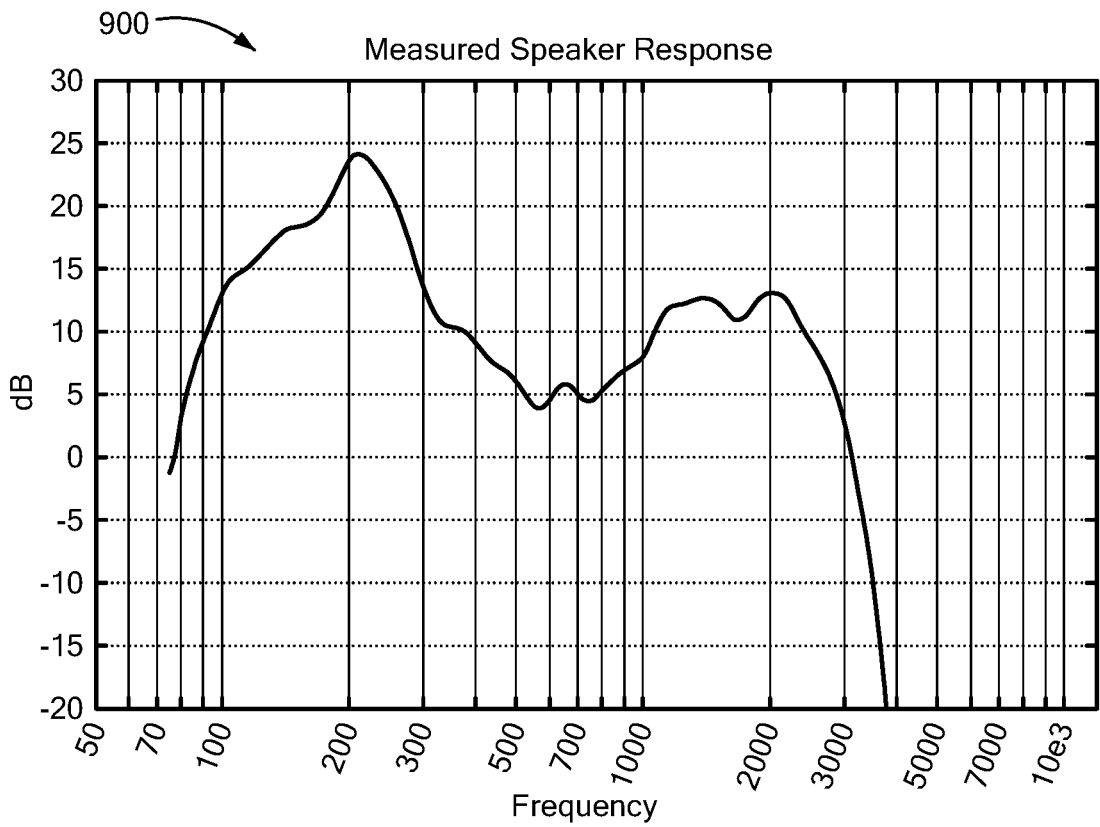
FIG. 9 is a plot showing a measured speaker/room response with a steep rolloff for an 8 kHz sample rate in the recording device, in accordance with an exemplary embodiment of the present disclosure.

FIG. 9 is a plot 900 showing an example speaker response with steep rolloff for an 8 kHz sample rate, in accordance with an exemplary embodiment of the present disclosure. In some cases, the microphone's response drops off very sharply outside of its nominal bandwidth. This may happen because the recording is made at a low sample rate, as shown in FIG. 9. This can make the ideal EQ response in the transition region have a sharp spike that makes the transition region have an undesirable response when using the method described above.

Figure 10:
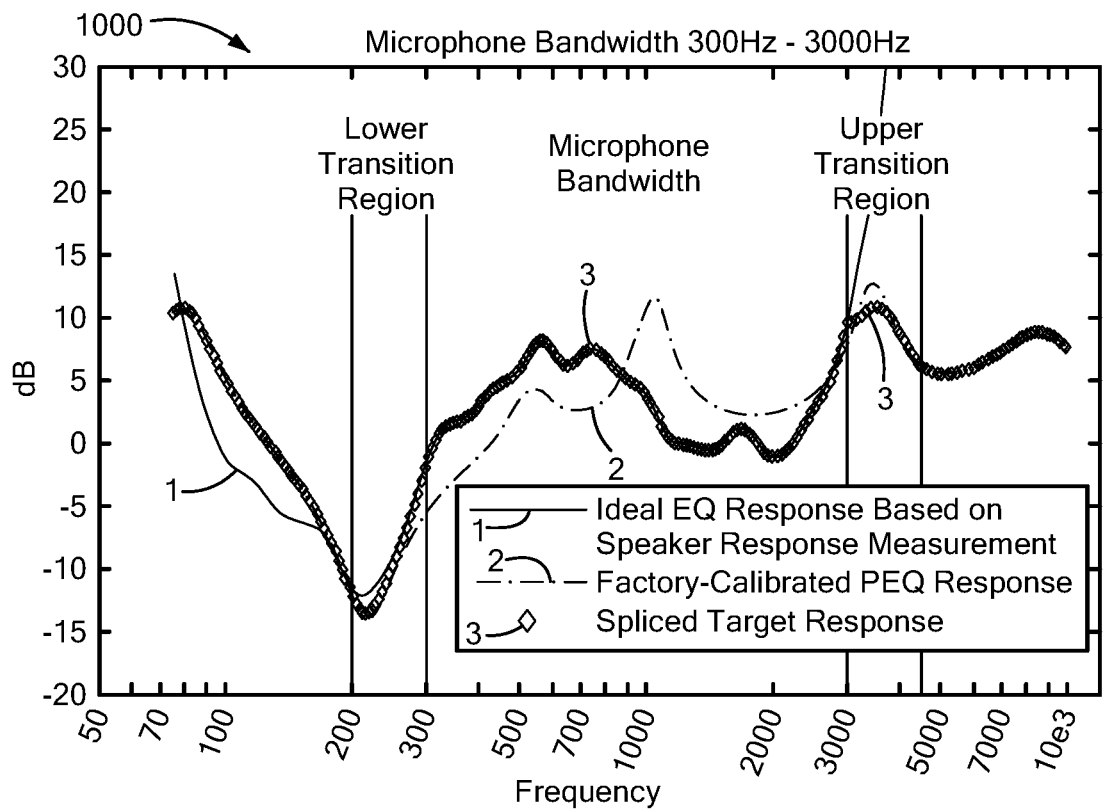
FIG. 10 is a plot showing an example of a modified upper transition region for a recording with a steep rolloff, in accordance with an exemplary embodiment of the present disclosure.

For this case, an alternative formula (EQ. 3) is preferably used for the upper transition region. The value of the ideal EQ response at the edge of the mic bandwidth ($H_{meas}(f2)$) is used as the $H_{meas}$ contribution to the linear transition across the region instead of H(f) This formula gives a smoother transition region and eliminates the contribution of the large spike in the ideal EQ response resulting from the steep rolloff in the speaker response. FIG. 10 is a plot 1000 showing an example of a modified upper transition region for steep rolloff, in accordance with an exemplary embodiment of the present disclosure.

$$H_{2mod}(f) = \frac{(f - f_2)*H_{fac}(f) + (\sqrt{2} f_2 - f)H_{meas}(f_2)}{\sqrt{2} f_2 - f_2} \quad \text{EQ. 3}$$

Equation 3: A half-octave solution where $H_{2mod}$ is the modified spliced response in the upper transition region, $f_2$ is the upper end of the mic bandwidth, $H_{meas}$ is the ideal EQ response based on the measurement and $H_{fac}$ is the factory-calibrated EQ response.

Once the measured and factory responses are spliced together, an automatic EQ algorithm according to the present disclosure (e.g., a genetic-based algorithm as described above for FIGS. 1-7) can proceed or be used to find the optimal solution(s) for the PEQ parameters. The initial values for the PEQ can be, e.g., either the factory PEQ parameters or can be chosen randomly. The result is that the television's speaker response is tuned to the room over the microphone's bandwidth, but retains the factory EQ response outside of it.

Figure 11:
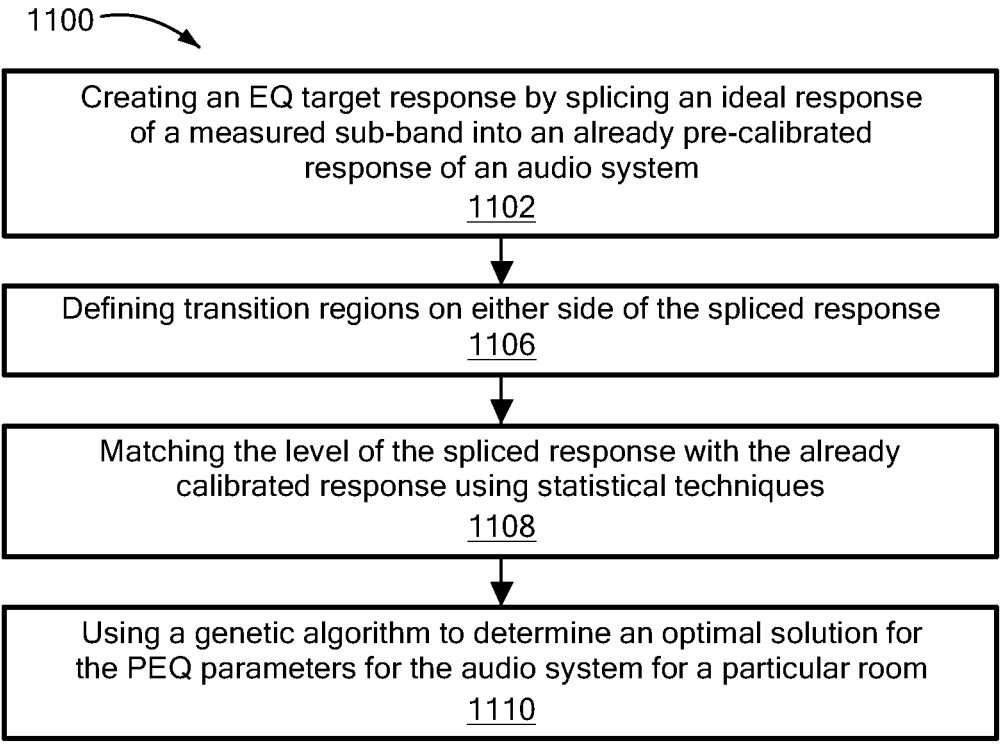
FIG. 11 is a box diagram of an example of a further method of adapting IIR filters to a given room, in accordance with the present disclosure.

FIG. 11 is a box diagram of an exemplary method 1100 of adjusting the EQ response of audio systems across a system microphone's bandwidth while preserving the factory-calibrated EQ response across the remaining bandwidth of the system. Method 1100, which may also be considered as an algorithm, includes a step in which an ideal response of a measured sub-band (e.g., corresponding to a system microphone) can be spliced into an already pre-calibrated response of an audio system, as shown at step 1102. Transition regions can be defined on either side of the spliced response, as shown at step 1104. The level of the spliced response can be matched with the already calibrated response using statistical techniques, as shown at step 1106. A genetic algorithm can be used to determine an optimal solution for the PEQ parameters for the combined (spliced response inserted into initial) for the audio system for a particular room, as shown at step 1108.

Figure 12:
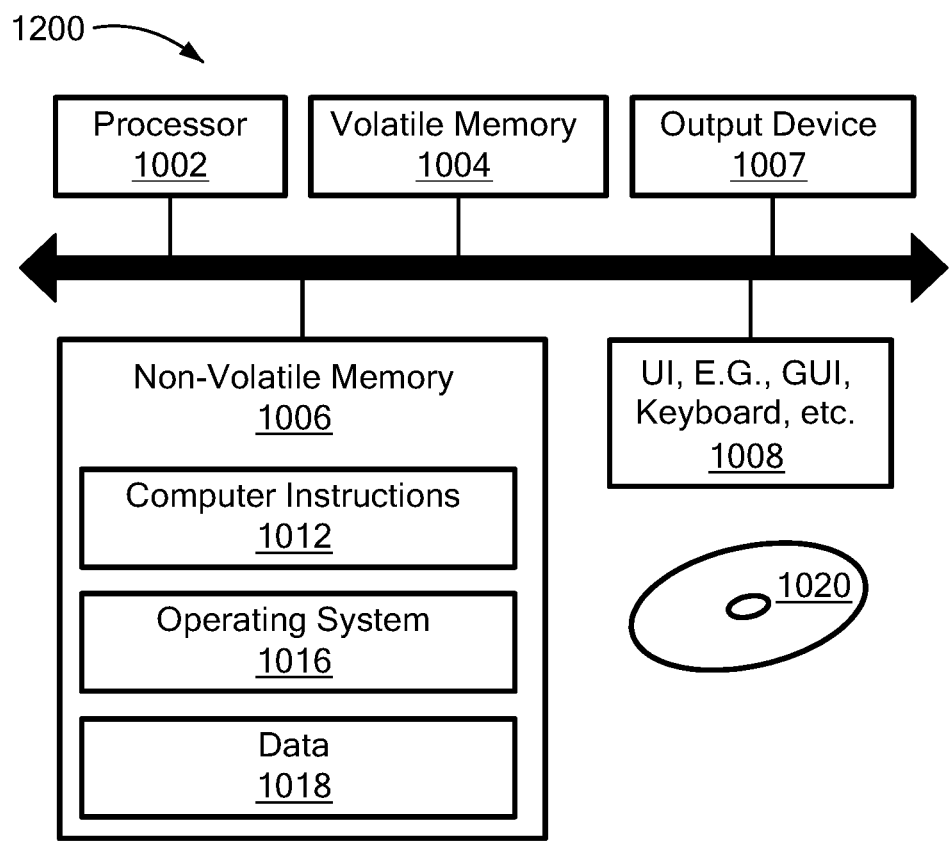
FIG. 12 is a schematic diagram of an example computer system that can perform all or at least a portion of methods, algorithms, and processing according to the present disclosure.

FIG. 12 is a schematic diagram of an example computer system 1200 that can perform all or at least a portion of the processing, e.g., steps in the algorithms and methods described herein and/or solving of equations EQS. 1-3. The computer system 1200 includes a processor 1202, a volatile memory 1204, a non-volatile memory 1006 (e.g., hard disk), an output device 1207 and a user input or interface (UI) 1208, e.g., graphical user interface (GUI), a mouse, a keyboard, a display, or any common user interface, etc. The non-volatile memory (non-transitory storage medium) 1206 stores computer instructions 1212 (a.k.a., machine-readable instructions or computer-readable instructions) such software (computer program product), an operating system 1216 and data 1218. In one example, the computer instructions 1212 are executed by the processor 1202 out of (from) volatile memory 1204. In one embodiment, an article 1220 (e.g., a storage device or medium such as a hard disk, an optical disc, magnetic storage tape, optical storage tape, flash drive, etc.) includes or stores the non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., port or bus) to perform processing and to generate output information.

The system 1200 can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Exemplary Embodiments: Exemplary embodiments are described below in the numbered clauses.

Clause 1: A system for adapting IIR filters of an audio equalizer (EQ) for a particular room, the system including: a memory comprising computer-executable instructions; and a processor coupled to the memory and operative to execute the computer-executable instructions, the computer-executable instructions causing the processor to perform operations comprising: (a) obtaining the system impulse response of a particular audio system for a particular room; (b) converting the impulse response to a frequency response; (c) comparing the frequency response to a target frequency response for the audio system; (d) deriving an ideal EQ response for the system, based on the comparison of the frequency response to the target frequency response; (e) implementing a genetic-based adaption algorithm creating a population of chromosomes, where each chromosome is a binary number that represents an encoded set of PEQ parameters; (f) performing fitness-based filter initialization; (g) incrementally introducing new bands; and, (h) producing a set of parametric EQ band parameters after a performance metric has been met, wherein the set of parametric EQ band parameters is adapted to the particular room.

Clause 2: The system of clause 1, wherein performing a fitness-based filter initialization includes implementing a fitness calculation based upon weighted frequency bands.

Clause 3: The system of clause 1, wherein performing a fitness-based filter initialization includes a filter initialization based upon a high-Q implementation at the largest current error peak.

Clause 4: The system of clause 1, wherein the processor further performs operations comprising using Gray coded PEQ parameters for genetic evolution.

Clause 5: A method for adapting a measured sub-band of an EQ response to an already calibrated EQ response of an audio equalizer (EQ) of an audio system for a particular room, the method including: (a) creating an EQ target by splicing the ideal response of a measured sub-band into the already pre-calibrated response; (b) defining transition regions on either side of the spliced response; and (c) using statistical techniques to match the level of the spliced response with the already calibrated response.

Clause 6: The method of clause 5, further including using a genetic-based adaption algorithm.

Clause 7: The method of clause 5, wherein the statistical technique is the mean calculation.

Clause 8: The method of clause 5, wherein, in the transition region calculation, there is a linear change between the measured response and the already calculated response.

Clause 9: The method of clause 5, wherein the measured response used in the transition region calculation is a constant value to avoid spikes in the spliced response caused by out of band roll-off in the measurement system.

Clause 10: The method of clause 5, wherein the transition region is one-half octave in width.

Clause 11: A method for adapting IIR filters of an audio equalizer (EQ) for a particular room, the method including: (a) obtaining the system impulse response; (b) conversion of the impulse response to a frequency response; (c) implementing a genetic-based adaption algorithm creating a population of chromosomes, where each chromosome is a binary number that represents an encoded set of PEQ parameters; (d) for the genetic-based adaption algorithm, implementing a non-random placement of initial filters; (e) introducing new bands incrementally; and (f) creating the EQ target by splicing the ideal response of a measured sub-band into the already pre-calibrated response.

Clause 12: The method of clause 11, further including defining transition regions on either side of the spliced response.

Clause 13: The method of clause 11, further including using statistical techniques to match the level of the spliced measured response with the pre-calibrated response.

Clause 14: A computer-readable non-transitory storage medium (or, computer program product) including instructions which, when executed by a computer, cause the computer to carry out the steps of the method of clause 5 and/or as recited in any of clauses 1-13.

Clause 15: A computer-readable non-transitory storage medium (or, computer program product) comprising instructions which, when executed by a computer, cause the computer to carry out the steps of the method of clause 11 and/or as recited in any of clauses 1-13.

Accordingly, embodiments of the inventive subject matter can afford benefits relative to prior art techniques. Such benefits may include, but are not limited to, adapting an off-the-shelf audio system, such as in a high-end television, to a given, particular room or other physical location presenting a specific or unique auditory environment with a set of acoustic properties.

Various embodiments of the concepts, systems, devices, structures, and techniques sought to be protected are described above with reference to the related drawings. Alternative embodiments can be devised without departing from the scope of the concepts, systems, devices, structures, and techniques described. It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that comprises a list of elements is not necessarily limited to only those elements but can include other elements not expressly listed or inherent to such apparatus, method, composition, mixture, or article.

Additionally, the term "exemplary" is means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A method for adapting a measured sub-band of an EQ response to a pre-calibrated EQ response of an audio equalizer (EQ) of an audio system for a particular room, the method comprising:
    a. creating an EQ target by splicing an ideal response of the measured sub-band into the pre-calibrated EQ response, thereby forming a spliced response;
    b. defining a transition region on both sides of the spliced response; and
    c. using a statistical technique to match a level of the spliced response with the pre-calibrated EQ response.

2. The method of claim 1, further comprising using a genetic-based adaption algorithm to calculate parametric EQ parameters for the EQ of the audio system.

3. The method of claim 1, wherein the statistical technique comprises a mean calculation.

4. The method of claim 1, wherein defining a transition region on both sides of the spliced response comprises providing a linear change between the measured sub-band of the EQ response and the pre-calculated EQ response.

5. The method of claim 1, wherein the measured sub-band of the EQ response used for defining a transition region comprises a constant value to avoid spikes in the spliced response.

6. The method of claim 1, wherein the transition region is one-half octave in width.

7. A computer-readable non-transitory storage medium comprising instructions which, when executed by a computer, cause the computer to carry out the steps of the method of claim 1.

8. A system for adapting a measured sub-band of an EQ response to a pre-calibrated EQ response of an audio equalizer (EQ) of an audio system for a particular room, the system comprising:
    a memory comprising computer-executable instructions; and
    a processor coupled to the memory and operative to execute the computer-executable instructions, the computer-executable instructions causing the processor to perform the steps of the method of claim 1.

* * * * *